United States Patent
Huang et al.

(10) Patent No.: US 8,563,340 B2
(45) Date of Patent: Oct. 22, 2013

(54) METHOD FOR MANUFACTURING LIGHT EMITTING CHIP

(75) Inventors: Shih-Cheng Huang, Hsinchu (TW); Po-Min Tu, Hsinchu (TW); Shun-Kuei Yang, Hsinchu (TW); Chia-Hung Huang, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 10 days.

(21) Appl. No.: 13/216,244

(22) Filed: Aug. 24, 2011

(65) Prior Publication Data

US 2012/0100648 A1  Apr. 26, 2012

(30) Foreign Application Priority Data

Oct. 26, 2010 (CN) .......................... 2010 1 0519376

(51) Int. Cl.
*H01L 21/00* (2006.01)
*H01L 33/60* (2010.01)
(52) U.S. Cl.
USPC ..................................... 438/29; 257/E33.072
(58) Field of Classification Search
USPC ..................................... 438/29; 257/E33.072
See application file for complete search history.

(56) References Cited

U.S. PATENT DOCUMENTS

| 7,768,022 B2 * | 8/2010 | Tsai et al. ........................ 257/98 |
| 2006/0079082 A1 | 4/2006 | Bruhns et al. |
| 2006/0099730 A1 * | 5/2006 | Lee et al. ......................... 438/46 |
| 2007/0018173 A1 * | 1/2007 | Yoo .................................. 257/79 |
| 2007/0164298 A1 * | 7/2007 | Kim et al. .......................... 257/94 |
| 2007/0275332 A1 * | 11/2007 | Bandic et al. .................. 430/320 |
| 2008/0224252 A1 * | 9/2008 | Suguro et al. ................. 257/499 |
| 2010/0295084 A1 * | 11/2010 | Tu et al. ........................... 257/98 |

FOREIGN PATENT DOCUMENTS

TW          200417054          9/2004

* cited by examiner

*Primary Examiner* — William D Coleman
*Assistant Examiner* — Christine Enad
(74) *Attorney, Agent, or Firm* — Altis & Wispro Law Group, Inc.

(57) ABSTRACT

A method for manufacturing light emitting chips includes steps of: providing a substrate having a plurality of separate epitaxy islands thereon, wherein the epitaxy islands are spaced from each other by channels; filling the channels with an insulation material; sequentially forming a reflective layer, a transition layer and a base on the insulation material and the epitaxy islands; removing the substrate and the insulation material to expose the channels; and cutting the reflective layer, the transition layer and the base to form a plurality of individual chips along the channels.

17 Claims, 16 Drawing Sheets

METHOD FOR MANUFACTURING LIGHT EMITTING CHIP

BACKGROUND

1. Technical Field

The present disclosure relates to a method for manufacturing light emitting chips, and more particularly, to a method for manufacturing light emitting chips having high light emitting efficiency.

2. Description of Related Art

As new type light source, LEDs are widely used in various applications. An LED often includes an LED chip to emit light. A conventional LED chip includes a substrate, and an N-type semiconductor layer, a light-emitting layer and a P-type semiconductor layer sequentially grown on the substrate. The substrate is generally made of sapphire ($Al_2O_3$) for providing growing environment to the layers. However, such sapphire substrate has a low heat conductive capability, causing that heat generated by the layers cannot be timely dissipated. Therefore, a new type substrate made of Si is developed. Such Si substrate has a thermal conductivity larger than that of the sapphire substrate so that the heat generated by the layers can be effectively removed.

Nevertheless, such Si substrate also has a problem that it absorbs the light emitted from the light-emitting layer due to the material characteristic thereof. Thus, the light extracting efficiency of the LED chip is limited.

What is needed, therefore, is a method for manufacturing light emitting chips which can overcome the limitations described above.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION OF THE EMBODIMENTS

A method for manufacturing light emitting chips in accordance with an embodiment of the present disclosure is disclosed. The method mainly includes multiple steps as described below.

Figure 1:
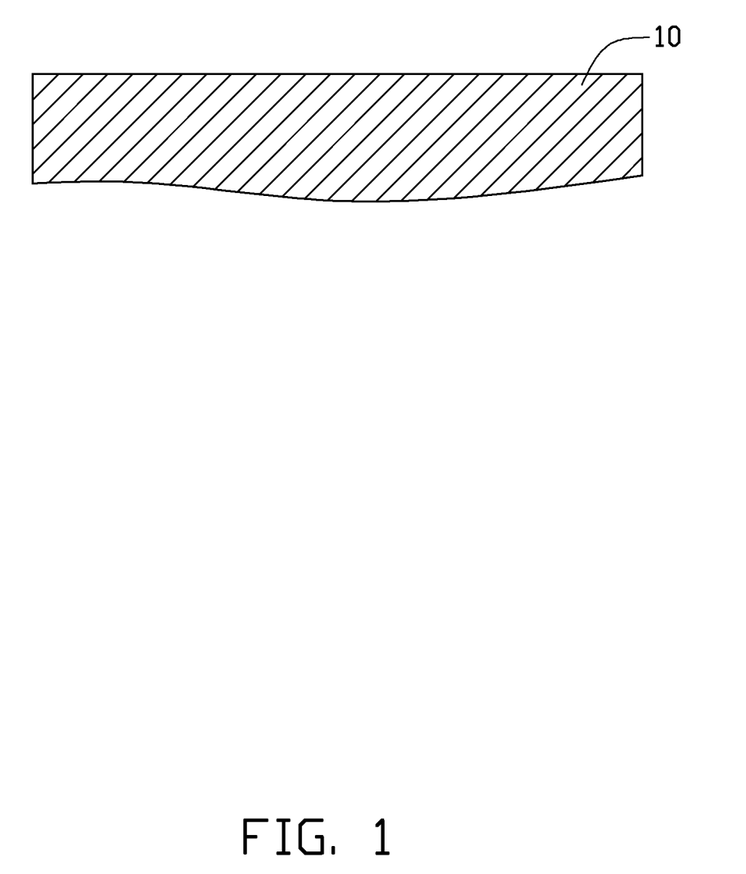
FIG. 1 shows a first process of a method for manufacturing light emitting chips in accordance with an embodiment of the present disclosure.

As shown in FIG. 1, a substrate 10 is provided. The substrate 10 is preferably made of Si. The substrate 10 has a flat top face for facilitating formation of semiconductor and other layers on the substrate 10.

Figure 2:
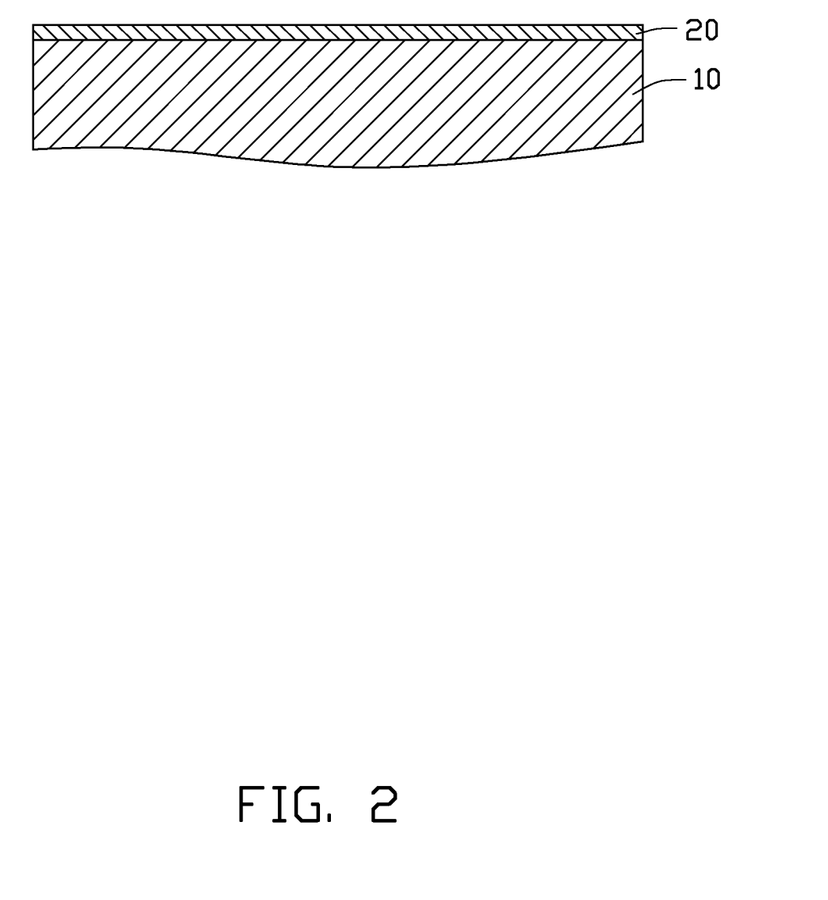
FIG. 2 shows a second process of the method of manufacturing light emitting chips in accordance with the embodiment of the present disclosure.

The substrate 10 is provided with a photoresist layer 20 on the top face thereof as shown in FIG. 2. The photoresist layer 20 may be made of positive photoresist material or negative photoresist material, depending on the actual requirements.

Figure 3:
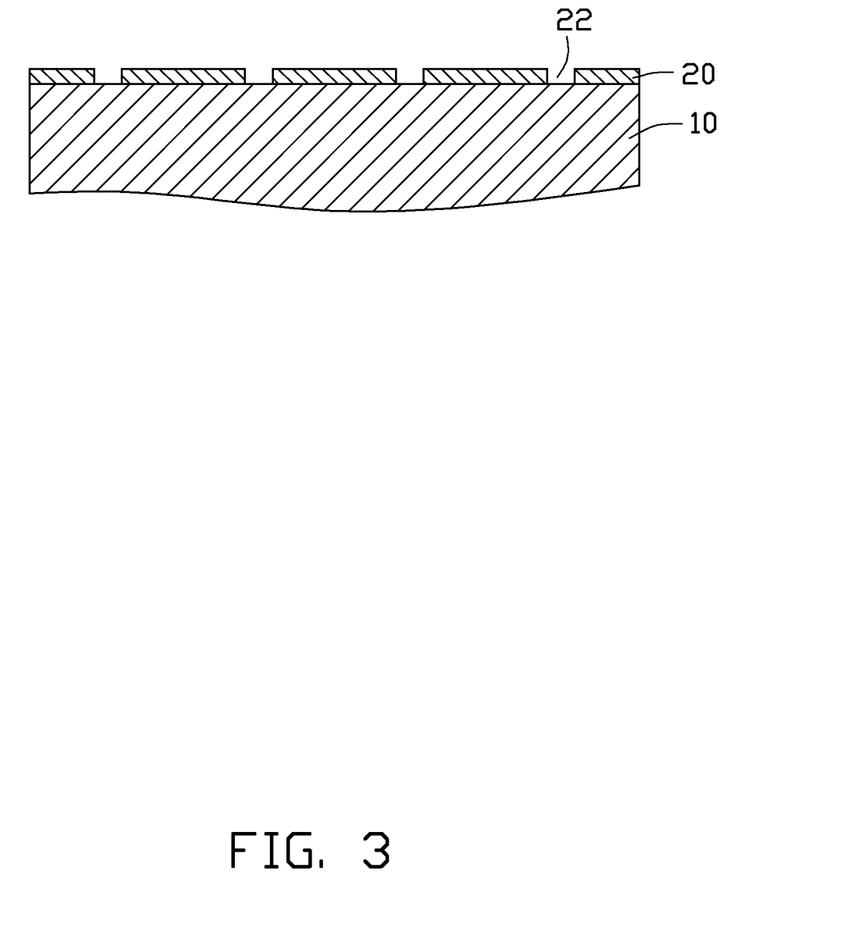
FIG. 3 shows a third process of the method of manufacturing light emitting chips in accordance with the embodiment of the present disclosure.

The photoresist layer 20 is patterned to form a plurality of individual islands as shown in FIG. 3. The islands of the photoresist layer 20 are spaced from each other by a plurality of gaps 22 between the islands. A plurality of areas of the top face of the substrate 10 are exposed to the gaps 22. The method for patterning the photoresist layer 20 may be microlithography or other suitable technologies.

Figure 4:
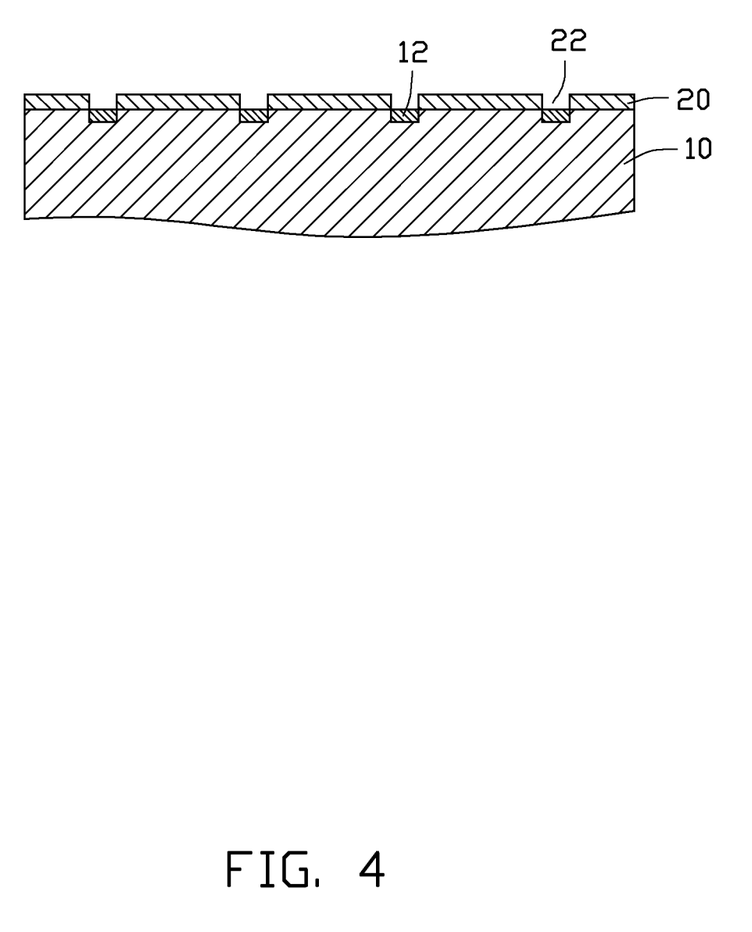
FIG. 4 shows a fourth process of the method of manufacturing light emitting chips in accordance with the embodiment of the present disclosure.

As shown in FIG. 4, the substrate 10 is then heated in an environment containing a large amount of oxygen or nitrogen so that the exposed areas of the top face of the substrate 10 are reacted to form $SiO_2$ or $Si_3N_4$. Such $SiO_2$ or $Si_3N_4$ acts as a blocking layer 12 which can prevent semiconductor structures from being grown therefrom. A temperature to heat the substrate 10 is preferably selected between 120 and 150 degrees centigrade. However, if high temperature-resistant material is employed to make the photoresist layer 20, the temperature to heat the substrate 10 can raise to a range between 200 and 250 degrees centigrade. The photoresist layer 20 does not react with the oxygen or nitrogen and remains to cover the remaining areas of the top face of the substrate 10.

Figure 5:
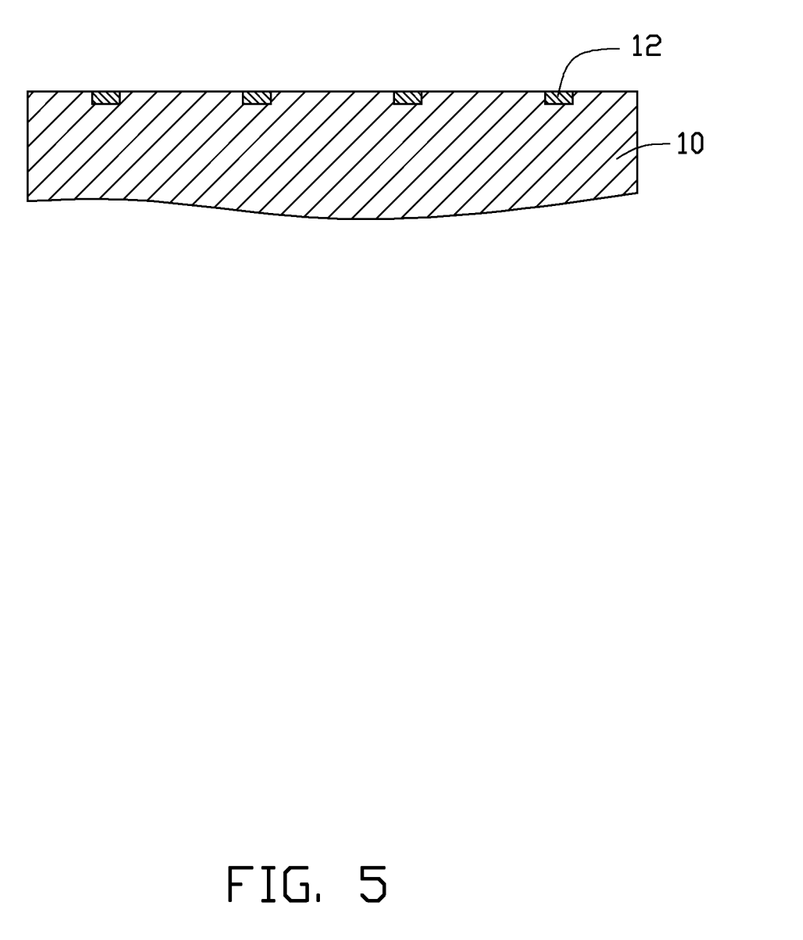
FIG. 5 shows a fifth process of the method of manufacturing light emitting chips in accordance with the embodiment of the present disclosure.

The photoresist layer 20 is removed to expose the remaining areas of the top face of the substrate 10 as shown in FIG. 5. The exposed remaining areas alternate with the reacted areas (i.e., the blocking layer 12) of the top face of the substrate 10. The photoresist layer 20 may be removed by development or other suitable methods.

Figure 6:
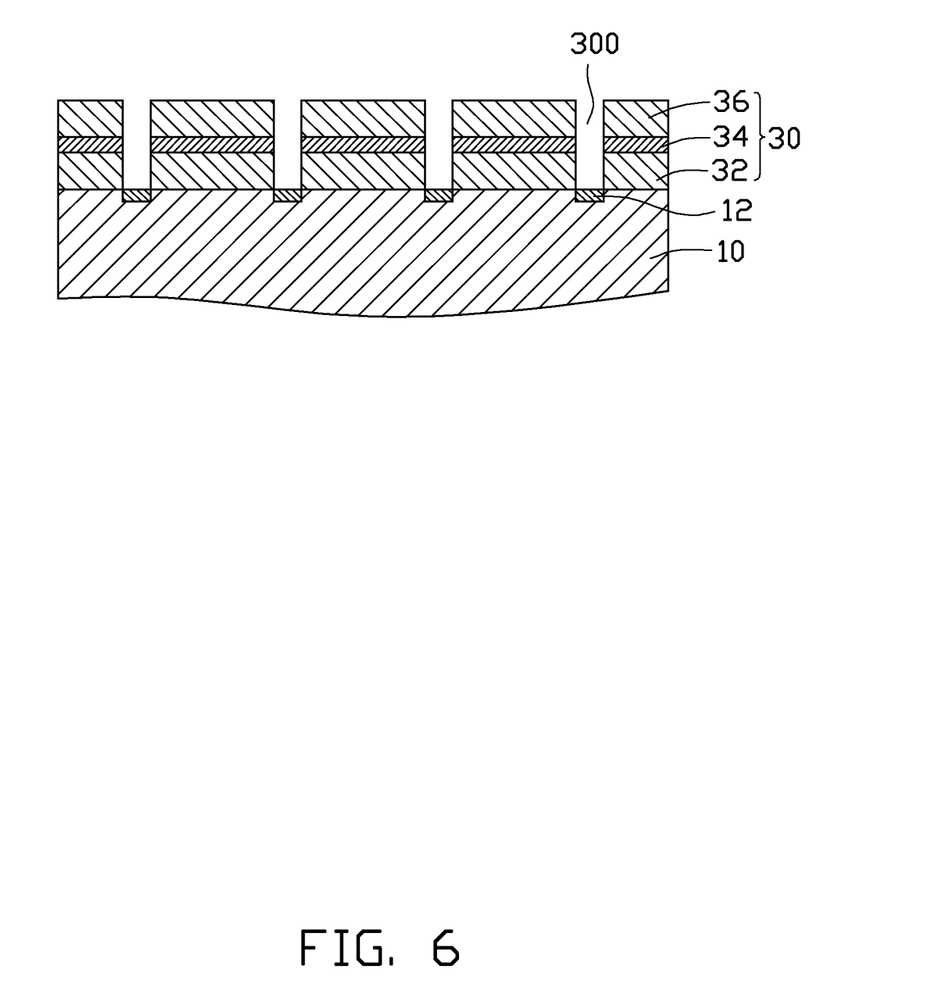
FIG. 6 shows a sixth process of the method of manufacturing light emitting chips in accordance with the embodiment of the present disclosure.

As shown in FIG. 6, an epitaxy structure 30 is formed on the substrate 10. The epitaxy structure 30 includes a first semiconductor layer 32, a light-emitting layer 34 and a second semiconductor layer 36 grown on the exposed areas of the top face of the substrate 10 sequentially. In this embodiment, the first semiconductor layer 32 is an N-type GaN layer, the second semiconductor layer 36 is a P-type GaN layer, and the light-emitting layer 34 is a muti-quantum wells GaN layer. Alternatively, the first semiconductor layer 32, the second semiconductor layer 36 and the light-emitting layer 34 can also be made of other suitable materials. Since the blocking layer 12 presented between the exposed areas of the top face of the substrate 10 prevents the epitaxy structure 30 from being grown therefrom, a plurality of channels 300 are defined just above the blocking layer 12 to divide the epitaxy structure 30 into a plurality of discrete blocks. However, in order to prevent the blocks of the epitaxy structure 30 from being grown laterally too much to connect with each other, a width of each channel 300 should be ensured twice more than a thickness of the epitaxy structure 30.

Figure 7:
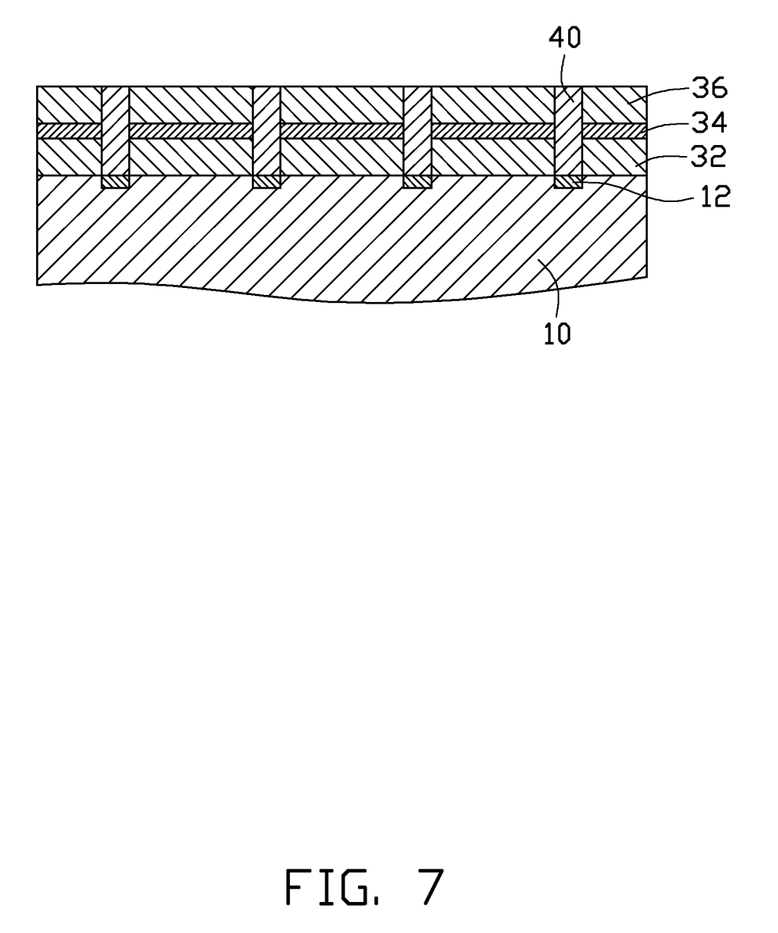
FIG. 7 shows a seventh process of the method of manufacturing light emitting chips in accordance with the embodiment of the present disclosure.

An insulation material 40 is further filled into the channels 300 to have a top face thereof coplanar with that of the epitaxy structure 30 as shown in FIG. 7. The insulation material 40 may be made of a material similar to that of the photoresist layer 20 or the blocking layer 12. Preferably, a photoresist material is selected in this embodiment since the photoresist material has a good performance of filling.

Figure 8:
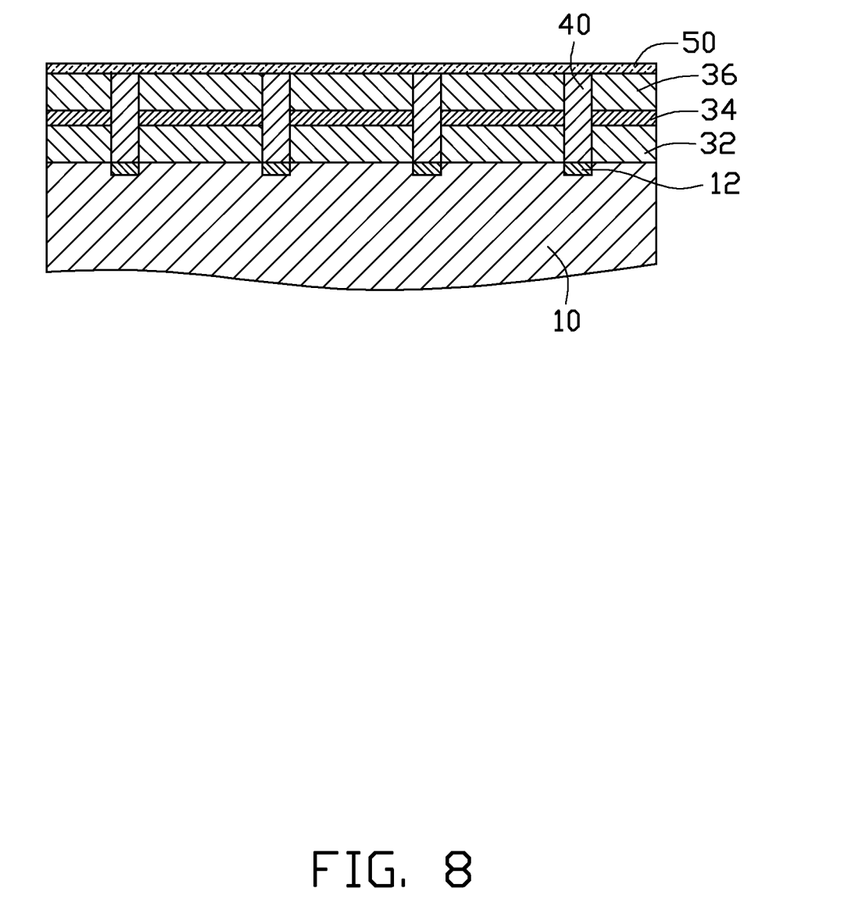
FIG. 8 shows an eighth process of the method of manufacturing light emitting chips in accordance with the embodiment of the present disclosure.

A reflective layer 50 is further formed on the top faces of the epitaxy structure 30 and the insulation material 40 as shown in FIG. 8. The reflective layer 50 is continuous to cover all the top faces of the epitaxy structure 30 and the insulation material 40. The reflective layer 50 may be made of aluminum, silver or gold and formed via an E-gun or a PECVD (Plasma Enhanced Chemical Vapor Deposition) technology. The reflective layer 50 can reflect light emitted from the light-emitting layer 34 towards an outside environment, thereby increasing light-extracting efficiency of the light emitting chips.

Figure 9:
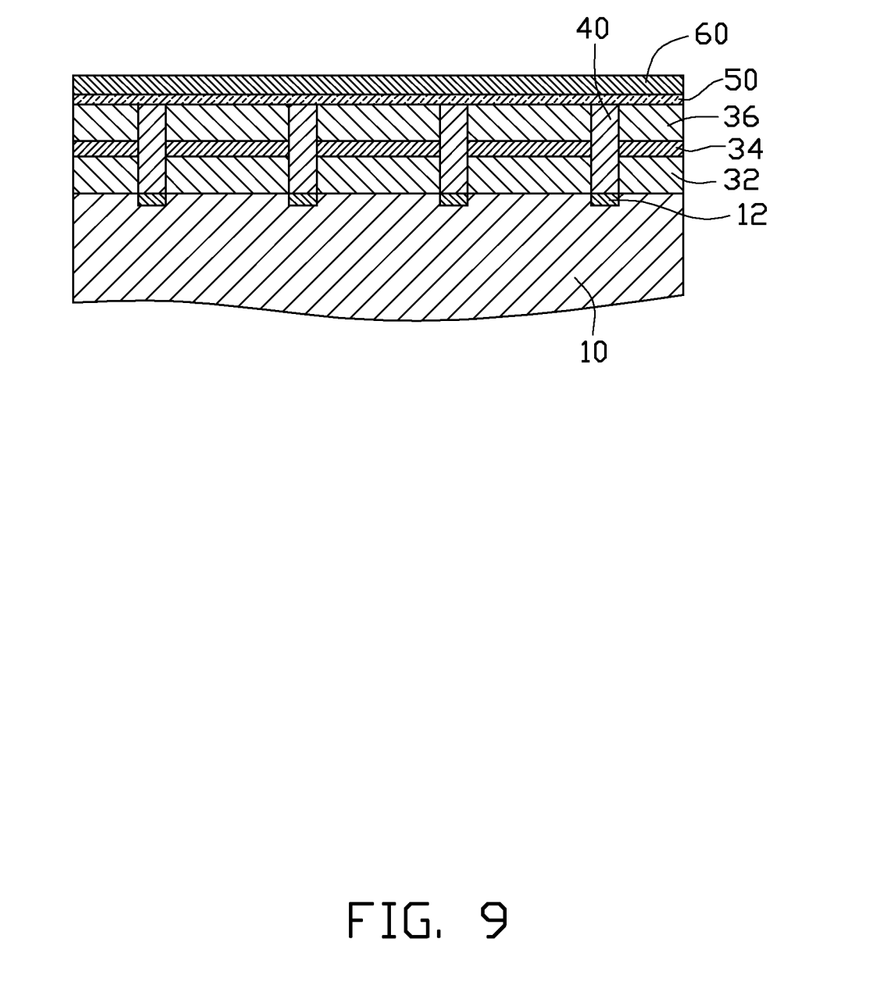
FIG. 9 shows a ninth process of the method of manufacturing light emitting chips in accordance with the embodiment of the present disclosure.

As shown in FIG. 9, a transition layer 60 is further formed on a top face of the reflective layer 50 via the E-gun or PECVD technology. The transition layer 60 may be made of silver, aluminum, gold or chrome. The transition layer 60 is used for joining another layer on the reflective layer 50.

Figure 10:
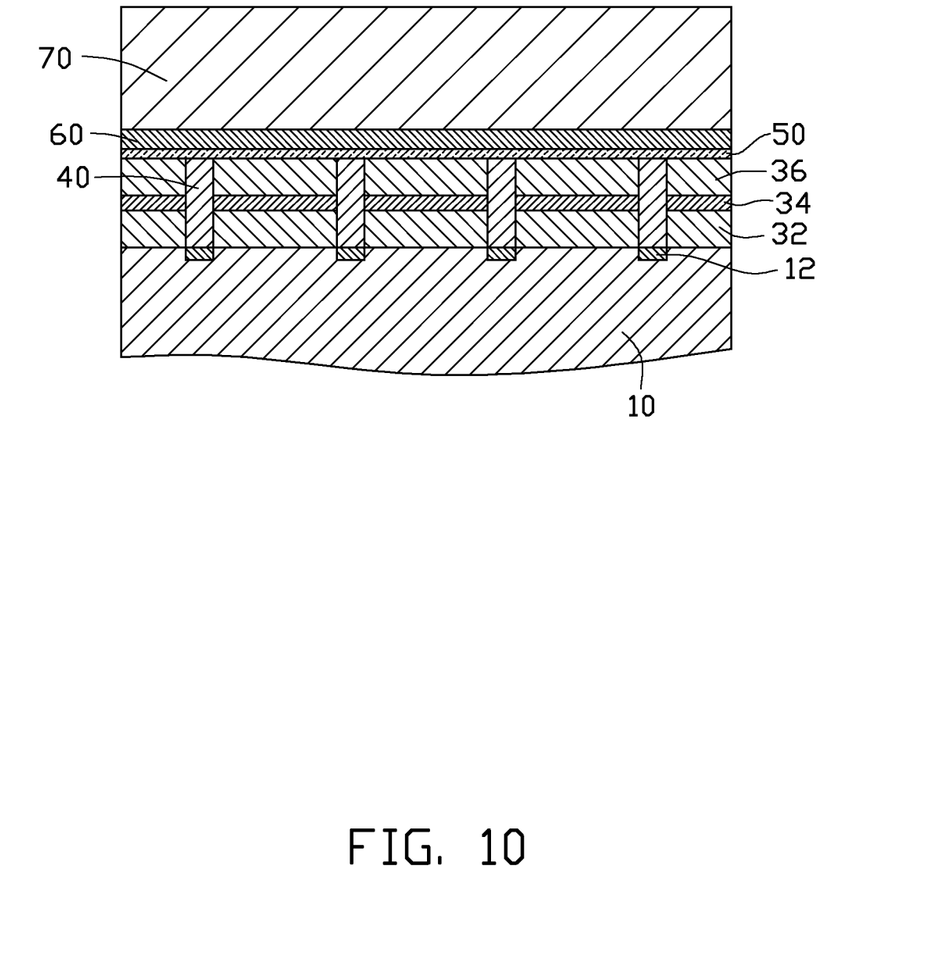
FIG. 10 shows a tenth process of the method of manufacturing light emitting chips in accordance with the embodiment of the present disclosure.

A base 70 is further formed on the transition layer 60 by electroplating as shown in FIG. 10. The base 70 may be made of silver, aluminum, gold or cooper. The base 70 has a thickness far larger than that of the reflective layer 50 and that of the transition layer 60. The base 70 functions to support the epitaxy structure 30 and absorb heat generated from the epitaxy structure 30. The base 70 also acts as a conductor for introducing current into the epitaxy structure 30.

Figure 11:
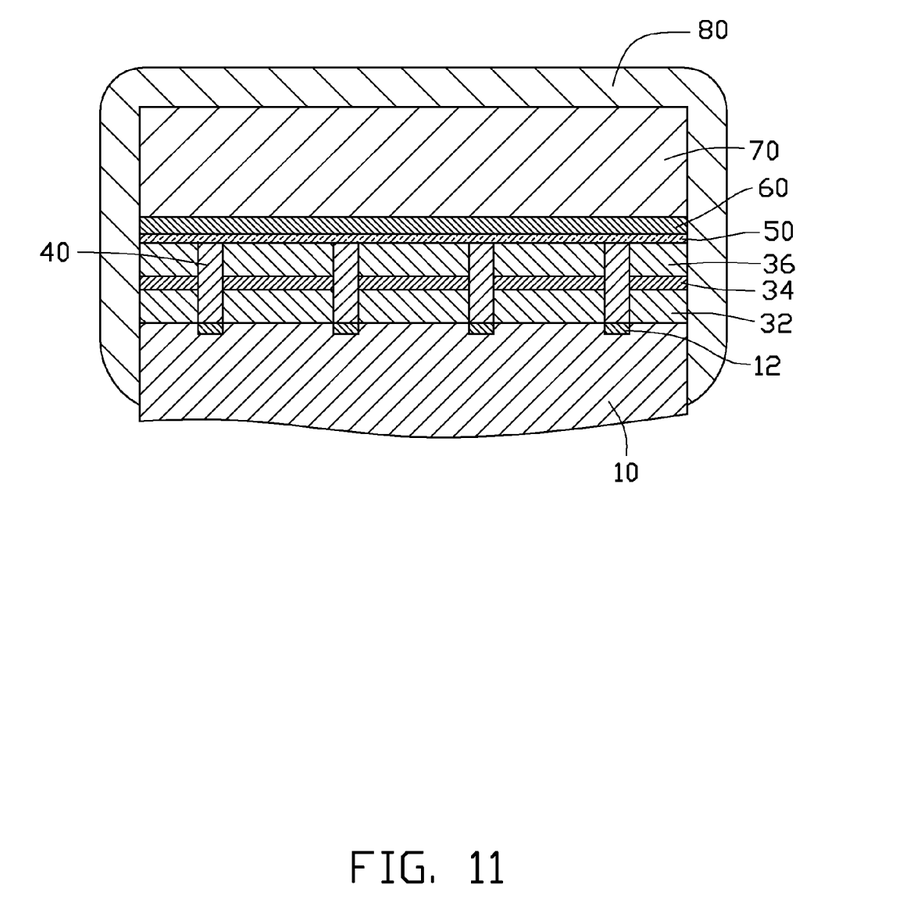
FIG. 11 shows an eleven process of the method of manufacturing light emitting chips in accordance with the embodiment of the present disclosure.

As shown in FIG. 11, a protective layer 80 is further provided to fully cover a top face of the base 70, lateral faces of the base 70, the transition layer 60, the reflective layer 50 and the epitaxy structure 30. The protective layer 80 also partially covers lateral sides of the substrate 10. A bottom face of the substrate 10 is not covered by the protective layer 80 and is exposed to an external environment. The protective layer 80 may be made of corrosion-resistant materials such as wax.

Figure 12:
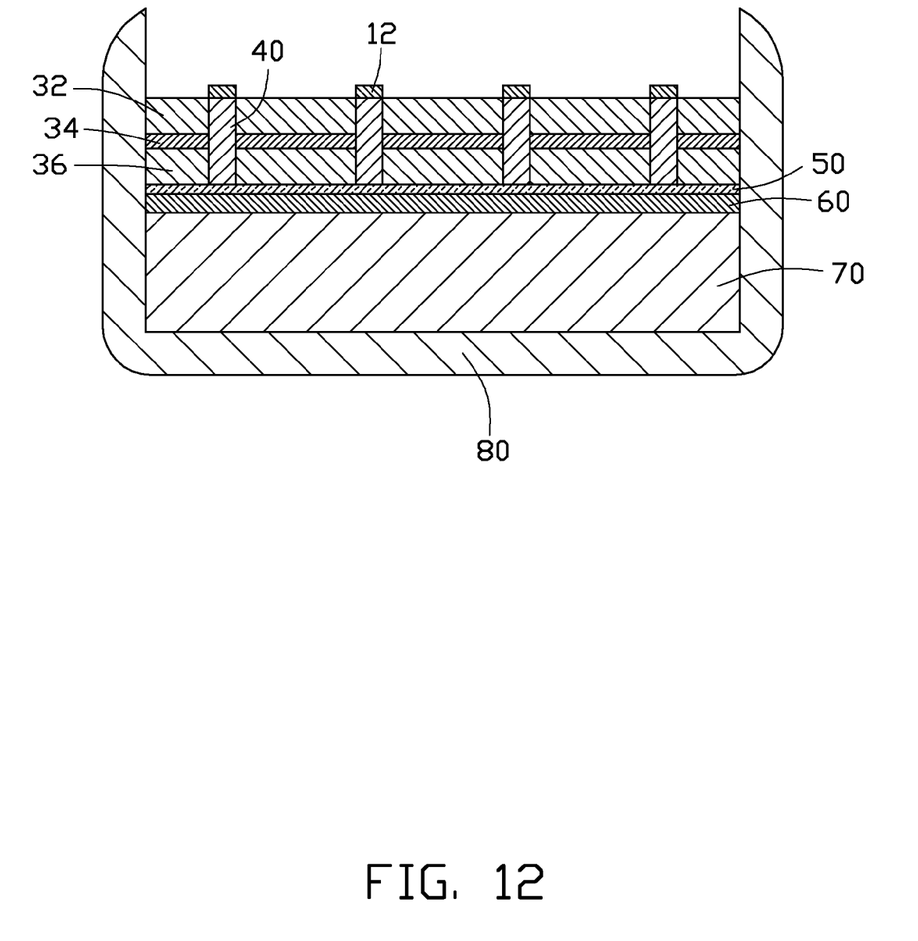
FIG. 12 shows a twelve process of the method of manufacturing light emitting chips in accordance with the embodiment of the present disclosure.

As shown in FIG. 12, the epitaxy structure 30 in combination with the other layers are inverted to render the bottom face of the substrate 10 facing upwardly, and the substrate 10 is wholly etched away to expose the bottom face of the first semiconductor layer 32 and the blocking layer 12. The epitaxy structure 30, the reflective layer 50, the transition layer 60 and the base 70 are protected by the protective layer 80 from the etching.

Figure 13:
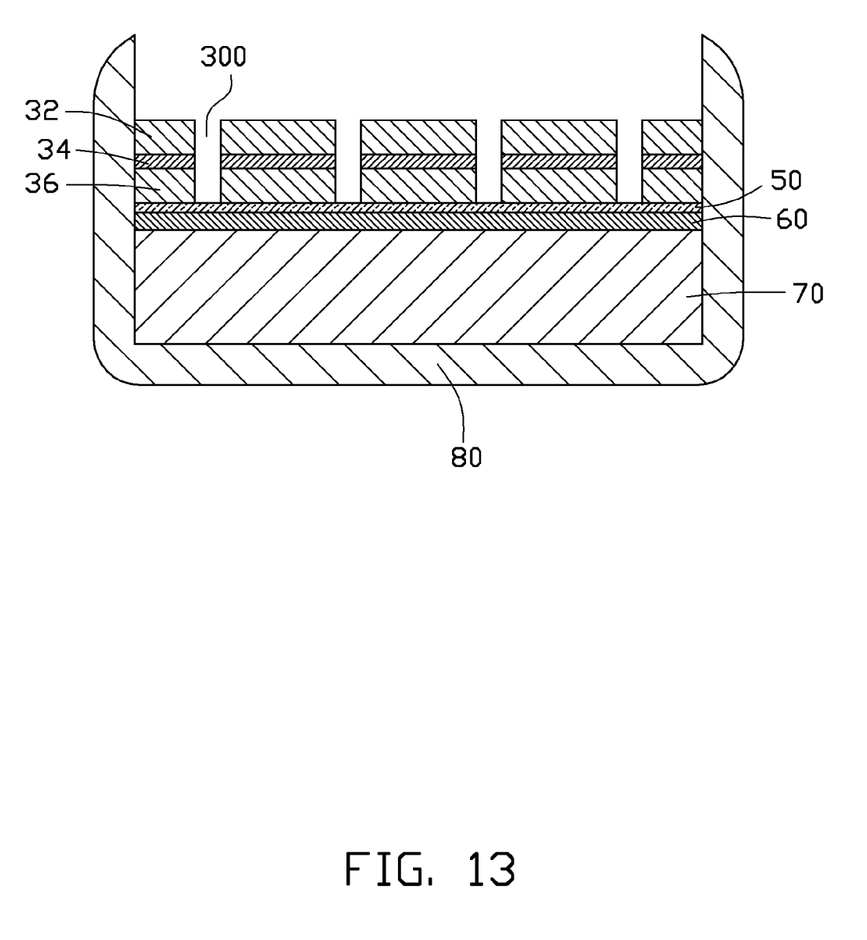
FIG. 13 shows a thirteenth process of the method of manufacturing light emitting chips in accordance with the embodiment of the present disclosure.

As shown in FIG. 13, the blocking layer 12 and the insulation material 40 are further removed from the epitaxy structure 30 by another etching or other methods, whereby the channels 300 in the epitaxy structure 30 are restored and exposed.

Figure 14:
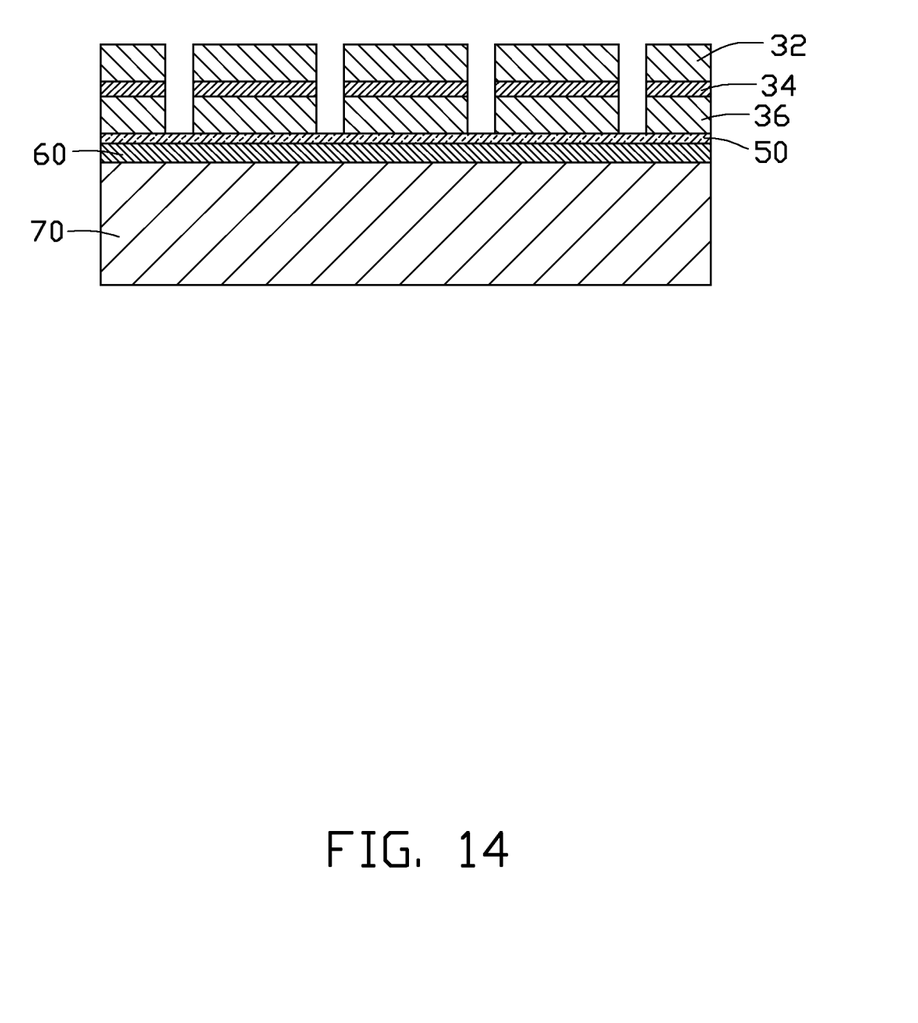
FIG. 14 shows a fourteenth process of the method of manufacturing light emitting chips in accordance with the embodiment of the present disclosure.

The protective layer 80 is then fully removed to expose the transition layer 60, the reflective layer 50 and the base 70 as shown in FIG. 14.

Figure 15:
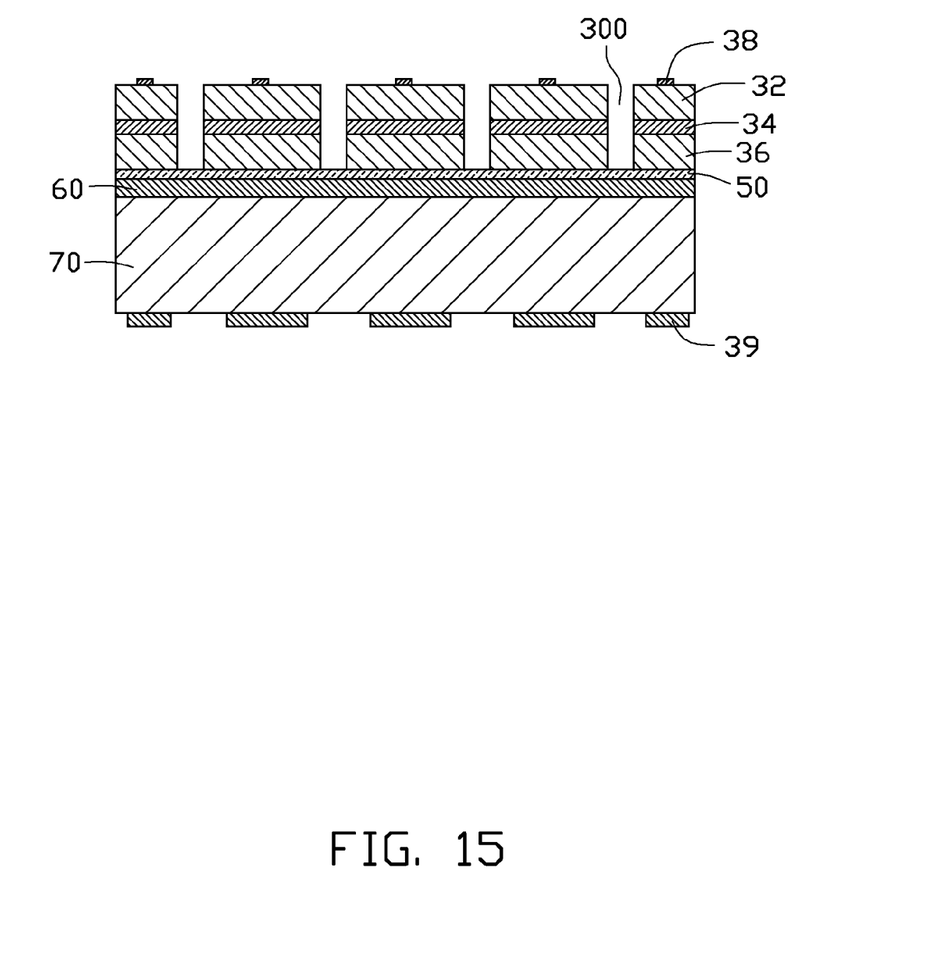
FIG. 15 shows a fifteenth process of the method of manufacturing light emitting chips in accordance with the embodiment of the present disclosure.

As shown in FIG. 15, multiple pairs of first and second electrodes 38, 39 are formed on the blocks of the epitaxy structure 30 and the base 70, respectively. Each first electrode 38 is made on a bottom face of the first semiconductor layer 32, and a corresponding second electrode 39 is made on the top face of the base 70.

Figure 16:
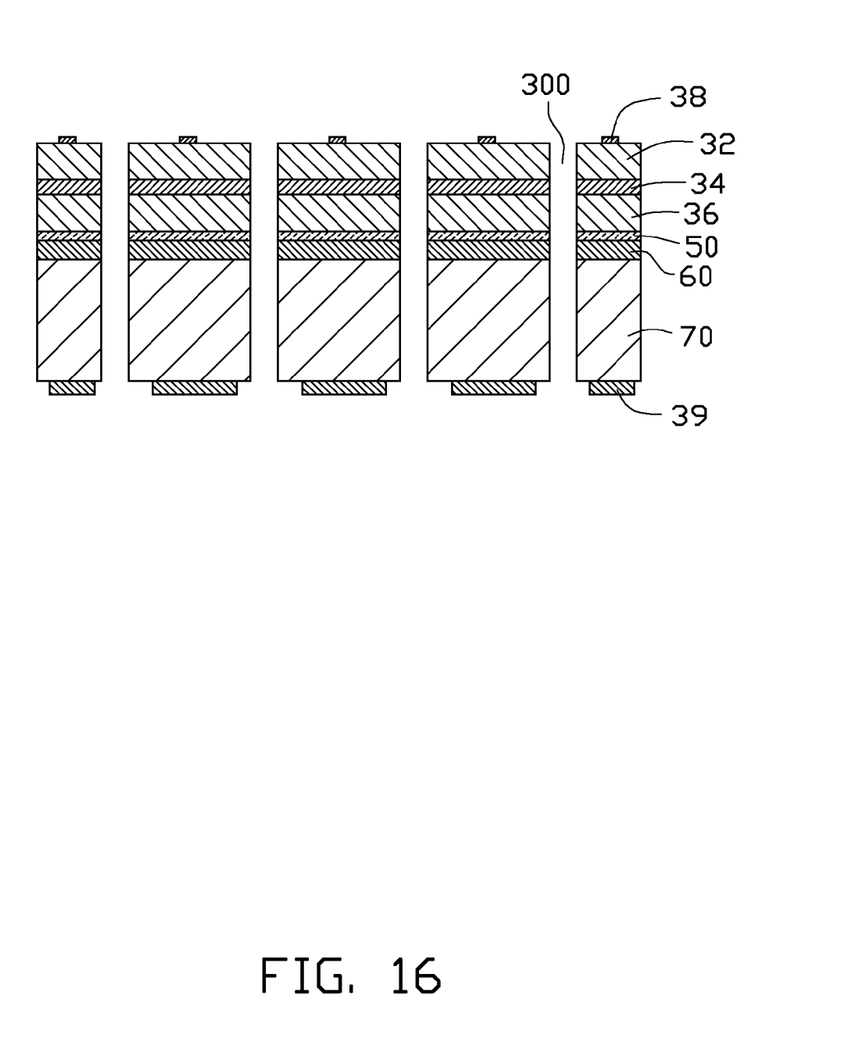
FIG. 16 shows light emitting chips which have been manufactured by the method of FIGS. 1-15.

As shown in FIG. 16, finally, the reflective layer 50 together with the transition layer 60 and the base 70, is cut to form a plurality of individual chips along the channels 300.

Since the original Si substrate 10 is removed and the reflective layer 50 is incorporated to the chip, the light extracting efficiency of the chip is enhanced. Furthermore, the metal base 70 can timely absorb much more heat from the epitaxy structure 30, thereby ensuring normal operation of the chip.

It is believed that the present disclosure and its advantages will be understood from the foregoing description, and it will be apparent that various changes may be made thereto without departing from the spirit and scope of the present disclosure or sacrificing all of its material advantages, the examples hereinbefore described merely being preferred or exemplary embodiments.

What is claimed is:

1. A method for manufacturing light emitting chips, comprising steps of:
   providing a substrate having an epitaxy layer formed thereon, the epitaxy layer being divided by channels into separate blocks;
   filling the channels with an insulation material;
   forming a continuous reflective layer on and directly connected to the insulation material and the epitaxy layer;
   forming a transition layer on the reflective layer after the reflective layer is formed;
   forming a base on the transition layer after the transition layer is formed;
   removing the substrate and the insulation material to expose the channels; and
   cutting the reflective layer along the channels to form multiple individual chips, respectively;
   wherein a protective layer is formed to cover the transition layer, the reflective layer, the base and the epitaxy layer before removing the insulation material and the substrate, a bottom face of the substrate is not covered by the protective layer, and the protective layer is removed after removing the substrate and the insulation material and before cutting the reflective layer.

2. The method for manufacturing light emitting chips of claim 1, wherein the substrate has a blocking layer formed in the channels, the blocking layer being substantially received within the substrate.

3. The method for manufacturing light emitting chips of claim 2, wherein the blocking layer is formed on the substrate prior to the formation of the epitaxy layer on the substrate.

4. The method for manufacturing light emitting chips of claim 3, wherein the blocking layer is made of $SiO_2$ or $Si_3N_4$.

5. The method for manufacturing light emitting chips of claim 4, wherein the blocking layer is formed following steps of: forming a photoresist layer on the substrate; patterning the photoresist layer to define a plurality of gaps in the photoresist layer; heating the substrate in an environment that a surface of the substrate exposed within the gaps is reacted to form the blocking layer; and removing the photoresist layer from the substrate.

6. The method for manufacturing light emitting chips of claim 5, wherein the epitaxy layer is formed on a portion of the substrate without the blocking layer, and the channels are formed in the epitaxy layer over the blocking layer.

7. The method for manufacturing light emitting chips of claim 5, wherein the environment for heating the substrate contains a large amount of $O_2$ or $N_2$.

8. The method for manufacturing light emitting chips of claim 5, wherein the heating temperature of the substrate ranges between 120 and 150 degrees centigrade.

9. The method for manufacturing light emitting chips of claim 2, wherein the blocking layer is made of a material the same as the insulation material.

10. The method for manufacturing light emitting chips of claim 2, wherein the blocking layer is removed together with the insulation material.

11. The method for manufacturing light emitting chips of claim 2, wherein the insulation material filling into the channels has a top face coplanar with that of the epitaxy layer.

12. The method for manufacturing light emitting chips of claim 11, wherein the insulation material is connected to the blocking layer.

13. The method for manufacturing light emitting chips of claim 1, wherein the transition layer, the reflective layer and the base are all made of metal.

14. The method for manufacturing light emitting chips of claim 13, wherein the base is formed on the transition layer by electroplating.

15. The method for manufacturing light emitting chips of claim 1, further comprising cutting the base and the transition layer and the reflective layer along the channels.

16. The method for manufacturing light emitting chips of claim 1, wherein the epitaxy layer comprises an N-type semiconductor layer, a light emitting layer and a P-type semiconductor layer.

17. The method for manufacturing light emitting chips of claim 1, wherein the substrate is made of Si.

\* \* \* \* \*